United States Patent
Tsai (10) Patent No.: US 9,537,534 B2
(45) Date of Patent: Jan. 3, 2017

(54) POWER LINE ETHERNET ADAPTOR AND POWER LINE ETHERNET COMMUNICATION KIT

(71) Applicant: Aeon Matrix Inc., Taipei (TW)

(72) Inventor: Ming-Je Tsai, Taipei (TW)

(73) Assignee: AEON MATRIX INC., Taipei (TW)

( * ) Notice: Subject to any disclaimer, the term of this patent is extended or adjusted under 35 U.S.C. 154(b) by 281 days.

(21) Appl. No.: 14/535,814

(22) Filed: Nov. 7, 2014

(65) Prior Publication Data

US 2015/0288419 A1 Oct. 8, 2015

(30) Foreign Application Priority Data

Apr. 3, 2014 (TW) .............................. 103112425 A (51) Int. Cl.
| | | |
|---|---|---|
| H04B 3/54 | (2006.01) |
| H04B 3/56 | (2006.01) |
| H04L 12/10 | (2006.01) |
| H05K 5/02 | (2006.01) |
| H04L 12/28 | (2006.01) |

(52) U.S. Cl.
CPC ................ *H04B 3/542* (2013.01); *H04B 3/56* (2013.01); *H04L 12/10* (2013.01); *H05K 5/0204* (2013.01); *H05K 5/0247* (2013.01); *H04B 2203/5454* (2013.01); *H04B 2203/5487* (2013.01); *H04L 2012/2843* (2013.01)

(58) Field of Classification Search
CPC ... H04B 3/542; H04B 3/56; H04B 2203/5454; H04B 2203/5487; H04L 12/10; H04L 2012/2843; H05K 5/0204; H05K 5/0247
See application file for complete search history.

(56) References Cited

U.S. PATENT DOCUMENTS

| | | | |
|---|---|---|---|
| 2004/0136384 A1* | 7/2004 | Cho ..................... H04L 12/4625 370/401 |
| 2005/0043907 A1 | 2/2005 | Eckel et al. |

(Continued)

FOREIGN PATENT DOCUMENTS

| | | |
|---|---|---|
| CN | 2272619 Y | 1/1998 |
| CN | 2807529 Y | 8/2006 |

(Continued)

*Primary Examiner* — Eric Oberly
(74) *Attorney, Agent, or Firm* — Muncy, Geissler, Olds & Lowe, P.C.

(57) ABSTRACT

A power line Ethernet adaptor is suitable to be applied to an external module including a first connector. The power line Ethernet adaptor includes a housing, a cover and a circuit board. The housing has an accommodating space. The cover is movably connected to the housing to move between an on-position and an off-position. When placed at the off-position, the cover covers the accommodating space. The circuit board is disposed in the accommodating space and has a power line Ethernet module and a second connector. When at least a part of the external module is disposed in the accommodating space, the first connector and the second connector are electrically connected to each other to establish the signal connection between the external module and the power line Ethernet module, and the cover also covers the external module when placed at the off-position.

20 Claims, 9 Drawing Sheets

(56) References Cited

U.S. PATENT DOCUMENTS

2007/0198866 A1* 8/2007 Martilik .................. G06F 1/266
                                                         713/300
2012/0082196 A1* 4/2012 Hurwitz ................. G01D 4/002
                                                         375/222

FOREIGN PATENT DOCUMENTS

| CN | 101223732 A | 7/2008 |
| CN | 101399566 A | 4/2009 |
| CN | 103682860 A | 3/2014 |

* cited by examiner

POWER LINE ETHERNET ADAPTOR AND POWER LINE ETHERNET COMMUNICATION KIT

CROSS REFERENCE TO RELATED APPLICATIONS

This Non-provisional application claims priority under 35 U.S.C. §119(a) on Patent Application No(s). 103112425 filed in Taiwan, Republic of China on Apr. 3, 2014, the entire contents of which are hereby incorporated by reference.

BACKGROUND OF THE INVENTION

Field of Invention

The invention relates to a power line Ethernet adaptor and a power line Ethernet communication kit and, in particular, to a power line Ethernet adaptor and a power line Ethernet communication kit suitable for the application of an external module.

Related Art

With the progress of technologies and the development of information as well as the wide application of computers, smart phones, tablet computers and smart mobile devices, Ethernet has become a very important part of human daily life. Since the Ethernet can rapidly and largely receive and transmit information, people heavily rely on the Ethernet to carry out social, recreational, commercial and academic activities everyday.

In the daily life (e.g. at home or office), it may happen that many people use the Ethernet to share message or information at the same time. Actually, people in the same building may be located at the same space (e.g. room or office) or different spaces. Whichever situation is, if the users want to establish a physical wiring for the Ethernet connection, the complicated wiring will not only increase the difficulty of construction but also raise the cost and cause an unpleasing environment.

To solve the above problem, the power line communication (PLC) has been developed. In fact, the PLC uses the power lines originally existing in the building as the backbone network for the signal transmission.

In the conventional art, when the user wants to join the electronic device to the power line communication, a network line or power line (plug) is required for the connection of the electronic device and PLC. However, through the above method, the network line or power line (plug) between the electronic device and the PLC is easy to make the user stumble and cause an issue of unattractive appearance.

Therefore, it is an important subject to provide a power line Ethernet adaptor and power line Ethernet communication kit so that the electronic device can be joined to the PLC without using the above-mentioned method.

SUMMARY OF THE INVENTION

In view of the foregoing subject, an objective is to provide a power line Ethernet adaptor and power line Ethernet communication kit so that the electronic device can be joined to the PLC without using the above-mentioned method.

To achieve the above objective, a power line Ethernet adaptor according to the invention is suitable to be applied to an external module including a first connector. The power line Ethernet adaptor includes a housing, a cover and a circuit board. The housing has an accommodating space. The cover is movably connected to the housing to move between an on-position and an off-position. When placed at the off-position, the cover covers the accommodating space. The circuit board is disposed in the accommodating space and has a power line Ethernet module and a second connector. When at least a part of the external module is disposed in the accommodating space, the first connector and the second connector are electrically connected to each other to establish the signal connection between the external module and the power line Ethernet module, and the cover also covers the external module when placed at the off-position.

To achieve the above objective, a power line Ethernet communication kit according to the invention comprises an external module and a power line Ethernet adaptor. The external module includes a first connector. The power line Ethernet adaptor includes a housing, a cover and a circuit board. The housing has an accommodating space. The cover is movably connected to the housing to move between an on-position and an off-position. When placed at the off-position, the cover covers the accommodating space. The circuit board is disposed in the accommodating space and has a power line Ethernet module and a second connector. When at least a part of the external module is disposed in the accommodating space, the first connector and the second connector are electrically connected to each other to establish the signal connection between the external module and the power line Ethernet module, and the cover also covers the external module when placed at the off-position.

In one embodiment, the cover moves between the on-position and the off-position by taking the joint of the cover and the housing as a pivot.

In one embodiment, the cover moves between the on-position and the off-position in a translation motion.

In one embodiment, the power line Ethernet module is electrically connected to a power line.

In one embodiment, the power line Ethernet module further includes an Ethernet communication unit and a processing unit. The Ethernet communication unit is connected to the second connector, converts an original signal from the first connector into a power line communication data and transmits it to the power line for the transmission, or obtains the power line communication data from the power line, converts it into the original signal and sends it to the second connector. The processing unit is connected to the Ethernet communication unit and controls the Ethernet communication unit.

In one embodiment, the power line Ethernet module further includes a power circuit and a transformer. The power circuit is connected to the power line and receives a power from the power line. The transformer is connected to the power circuit, the second connector, the Ethernet communication unit and the processing unit, and transmits the power from the power circuit to the second connector, the Ethernet communication unit and the processing unit. The processing unit is connected to the power circuit and the second connector and controls the power circuit and the second connector.

In one embodiment, the circuit board further includes an Ethernet port. The Ethernet port and the Ethernet communication unit are connected to each other and exchange an Ethernet data.

In one embodiment, the circuit board further includes a power supply unit, and the power supply unit is connected to the power line, and receives the power from the power line and outputs a working power. The power supply unit is a power socket or a power switch.

In one embodiment, at least a part of the housing is suitable to be embedded into a wall surface of a building.

In one embodiment, the cover has a transparent portion.

In one embodiment, the cover further includes a through hole, the circuit board further includes a speech processing module, and the position of the through hole corresponds to the speech processing module.

In one embodiment, the cover further includes a through hole, the circuit board further includes a speaker, and the position of the through hole corresponds to the speaker.

As mentioned above, the power line Ethernet adaptor of the invention is suitable to work with an external module to form a power line Ethernet communication kit. The external module includes the first connector and the power line Ethernet adaptor includes the second connector. The first connector and the second connector can be electrically connected to each other to establish the signal connection between the external module and the power line Ethernet module. Therefore, the external module can be joined to the power line Ethernet through the power line Ethernet adaptor. In detail, the external module and the power line Ethernet adaptor can be connected to each other without through a physical Ethernet line or electric line (plug), and therefore the probability of the user being stumbled by the physical Ethernet line or electric line can be reduced.

Furthermore, the housing of the power line Ethernet adaptor has an accommodating space and the circuit board can be disposed therein. Therefore, when the first connector of the external module is electrically connected to the second connector of the circuit board, the external module is also disposed in the accommodating space. Besides, the cover of the power line Ethernet adaptor is movably connected to the housing so that the cover can move between the on-position and the off-position. When the external module is disposed in the housing and the cover is placed at the off-position, the cover can cover the external module. Thereby, the occupied space can be saved, and the connection between the external module and the power line Ethernet adaptor is uneasy to be loosed, short-circuited or oxidized due to the influence of the outside environment.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

To be noted, the all embodiments shown in the figures are just for the illustrative purpose but not for representing the actual dimensions and ratios.

Figure 1:
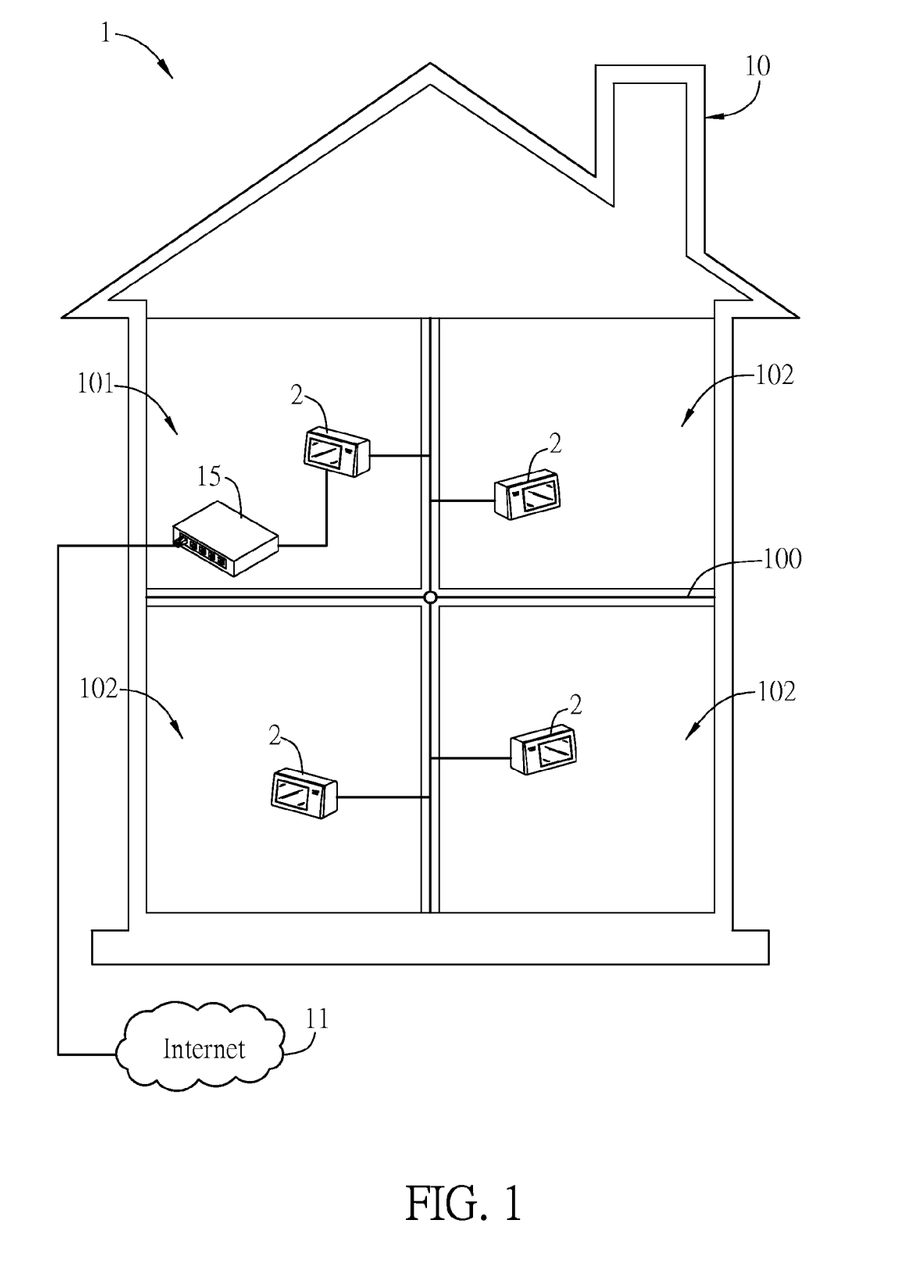
FIG. 1 is a schematic diagram of a power line Ethernet system of an embodiment of the invention.

FIG. 1 is a schematic diagram of a power line Ethernet system of an embodiment of the invention. As shown in FIG. 1, the power line Ethernet system 1 is built in a building 10 having a power line 100. The power line 100 provides the electric power from the power company for the users in the building 10. The building 10 can be a dwelling, commercial or educative building or another functional building. In this embodiment, the building 10 has many spaces, wherein the first space 101 has a router 15, which is connected to the Internet 11 and receives the Ethernet signal transmitted through the Internet 11. When the router 15 receives the Ethernet signal transmitted by the Internet 11, the Ethernet signal will be modulated to the power line 100 through the power line Ethernet adaptor 2 and then transmitted through the power signal serving as the carrier wave. The power line Ethernet adaptors 2 in other spaces 102 can receive and demodulate the Ethernet signal transmitted by the power line 100. The detail components and functions of the power line Ethernet adaptor 2 of this embodiment will be illustrated later.

Figure 2A:
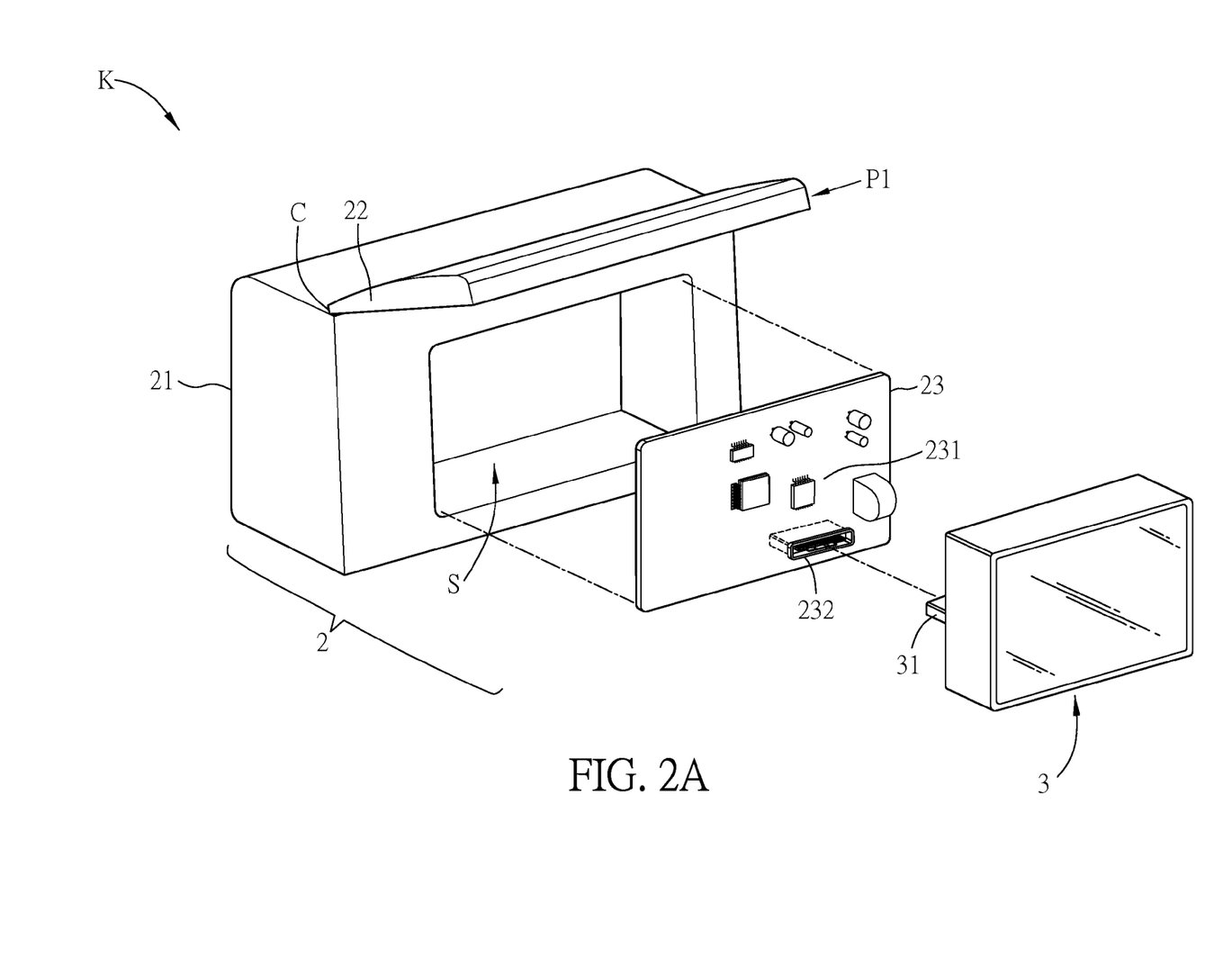
FIG. 2A is a schematic front exploded view of a power line Ethernet communication kit of an embodiment of the invention.
Figure 2B:
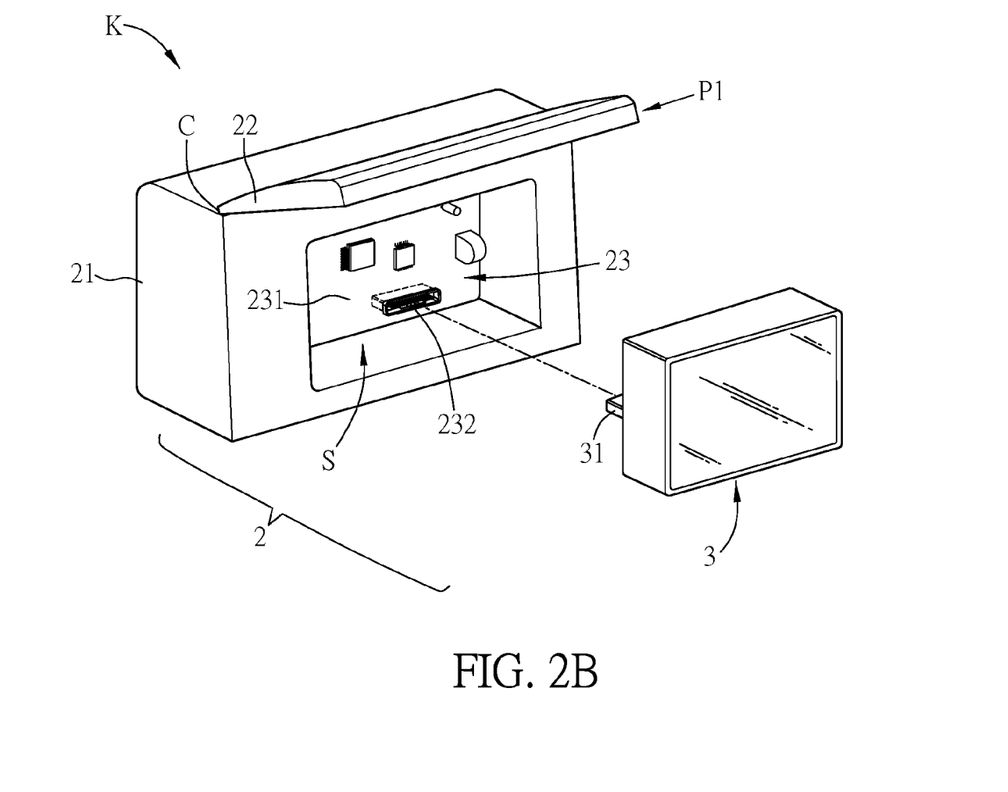
FIG. 2B is a schematic partially assembled diagram of the power line Ethernet communication kit of FIG. 2A.
Figure 2C:
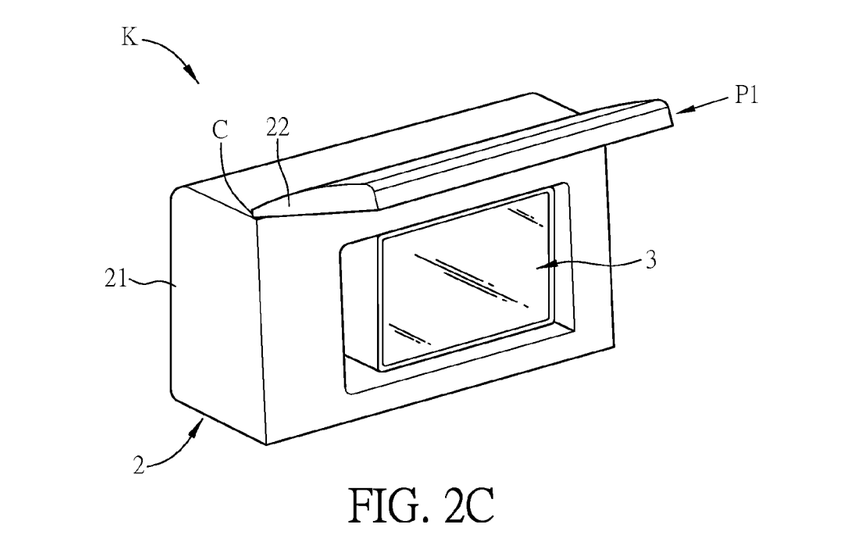
FIG. 2C is a schematic diagram of the cover of the power line Ethernet communication kit as shown in FIG. 2B placed in an on-position state.
Figure 2D:
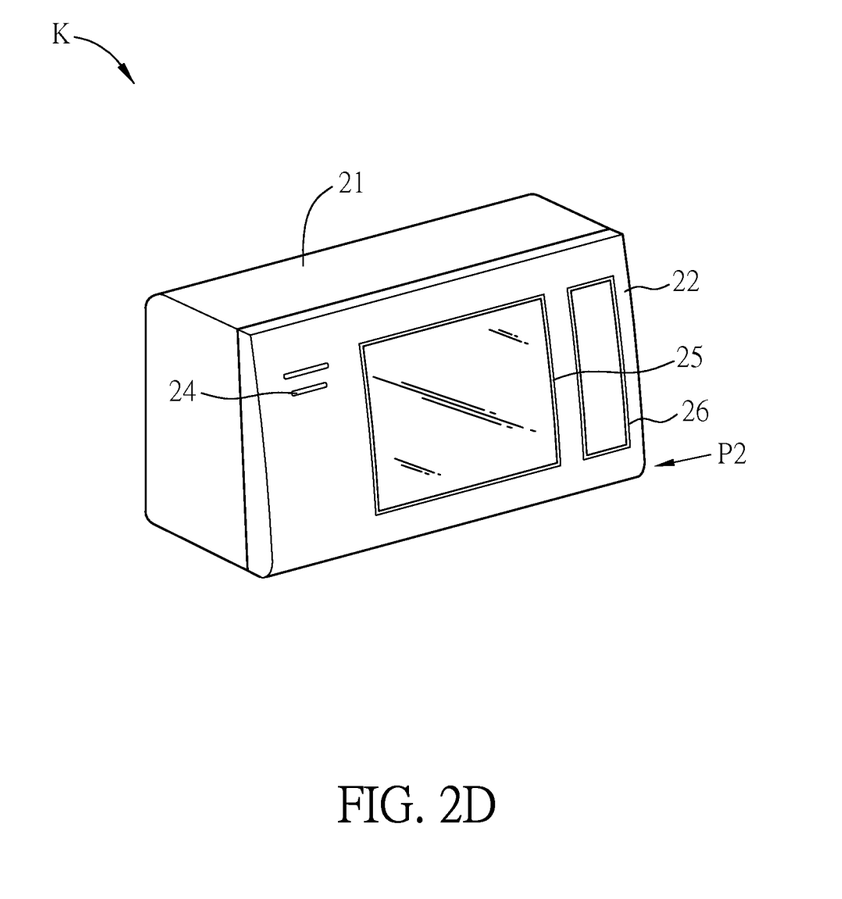
FIG. 2D is a schematic diagram of the cover of the power line Ethernet communication kit as shown in FIG. 2B placed in an off-position state.
Figure 2E:
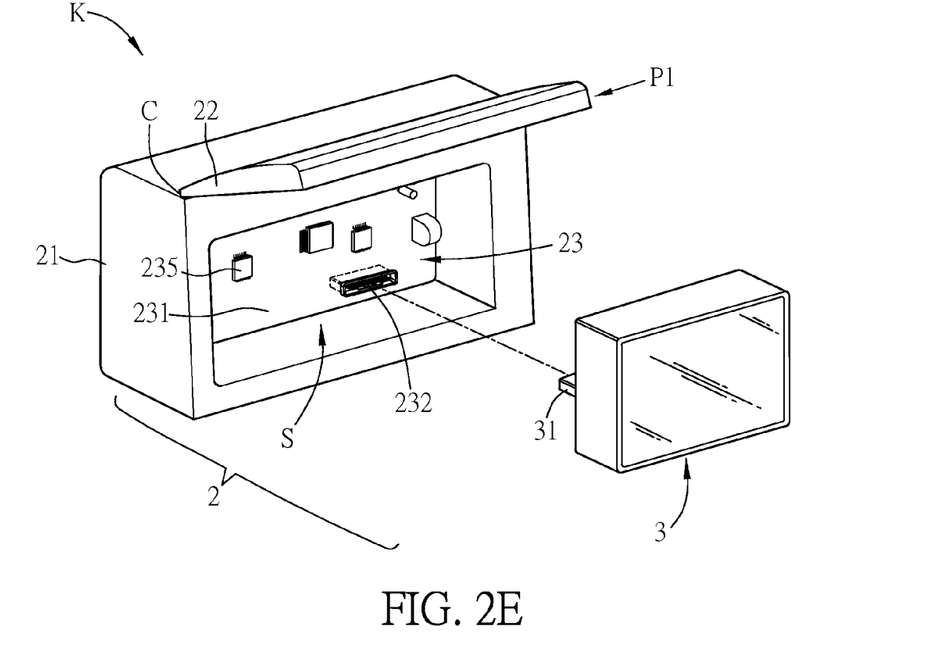
FIGS. 2E and 2F are schematic diagrams of other embodiments of the power line Ethernet communication kit in FIG. 2B.
Figure 2F:
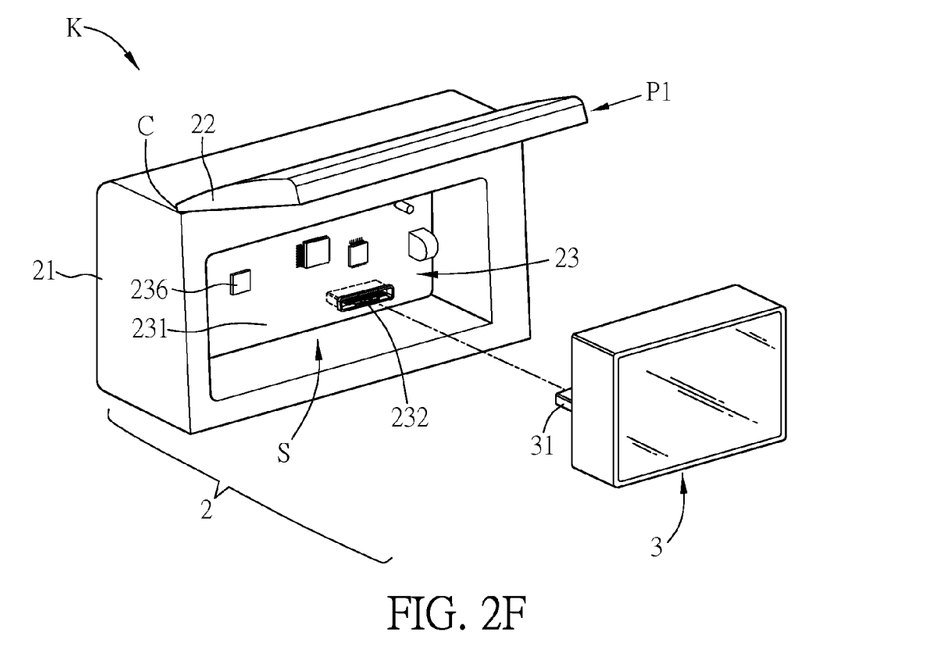

FIG. 2A is a schematic front exploded view of a power line Ethernet communication kit of an embodiment of the invention, FIG. 2B is a schematic partially assembled diagram of the power line Ethernet communication kit of FIG. 2A, FIG. 2C is a schematic diagram of the cover of the power line Ethernet communication kit as shown in FIG. 2B placed in an on-position state, and FIG. 2D is a schematic diagram of the cover of the power line Ethernet communication kit as shown in FIG. 2B placed in an off-position state. FIGS. 2E and 2F are schematic diagrams of other embodiments of the power line Ethernet communication kit in FIG. 2B.

As shown in FIG. 2A, in this embodiment, the power line Ethernet communication kit K includes a power line Ethernet adaptor 2 and an external module 3. The power line Ethernet adaptor 2 is suitable for the application of the external module 3 having a first connector 31. The power line Ethernet adaptor 2 is electrically connected to the power line of the building, so the external module 3 can be joined to the power line Ethernet system (as shown in FIG. 1) through the power line Ethernet adaptor 2, and therefore the data or information transmission can be performed by the power line serving as the transmission medium.

In this embodiment, the power line Ethernet adaptor 2 includes a housing 21, a cover 22 and a circuit board 23. The housing 21 has an accommodating space S. The cover 22 is movably connected to the housing 21. Herein, the so-called "movably connected to" means the cover 22 can move between an on-position P1 and an off-position P2 (as shown in FIG. 2D) relative to the housing 21 according to the user's requirement. In this embodiment, the cover 22 moves between the on-position P1 and the off-position P2 just as lifted up and lowered down on the joint C of the cover 22 and the housing 21 as the pivot. In other embodiments, the cover 22 can move in other ways, such as translation motion, so that the cover 22 moves between the on-position and the off-position. In detail, the on-position reveals the accommodating space S and the off-position hides the accommodating space S by the cover 22.

In this embodiment, the circuit board 23 has a power line Ethernet module 231 and a second connector 232. The standard and type of the second connector 232 corresponds to the first connector 31 of the external module 3, and thereby the connectors 232, 31 can be electrically connected to each other for establishing the signal connection between the external module 3 and the power line Ethernet module 231. To be noted, the circuit board 23 (also with the components thereon) shown in the figure is just for the illustrative purpose but not for limiting the scope of the invention.

In the actual application, the size of the circuit board 23 is favorably the same as that of the accommodating space S, and therefore the circuit board 23 can be disposed in the accommodating space S of the housing 21, as shown in FIG. 2B, and can be connected to the power line (100 in FIG. 1) built in the building. The external module 3 can be electrically connected to the second connector 232 on the circuit board 23 through the first connector 31 and at least a part of the external module 3 is disposed in the accommodating space S, as shown in FIG. 2C. In detail, the cover 22 shown in FIG. 2C is placed at the off-position P1, and when the cover 22 is rotated and lowered down to the off-position P2, the cover 22 will cover the accommodating space S and the external module 3, as shown in FIG. 2D.

As shown in FIGS. 2D and 2E, the cover 22 can have a through hole 24 (as shown in FIG. 2D), and the circuit board 23 has a speech processing module 235 (as shown in FIG. 2E), which is disposed corresponding to the position of the through hole 24. The through hole 24 is mainly used to receive the outside speech data, and the speech processing module 235 can process the speech data and even the external module 3 can operate according to the content of the speech data. In some embodiments, the housing 22 of the power line Ethernet adaptor 2 can further have a display panel 25, which can display the content of the speech data. However, the invention is not limited thereto.

As shown in FIGS. 2D and 2F, the circuit board 23 can further include a speaker 236 (as shown in FIG. 2F), which is disposed corresponding to the position of the through hole 24 (as shown in FIG. 2D). The speaker 236 can emit the sound data through the through hole 24.

Figure 3:
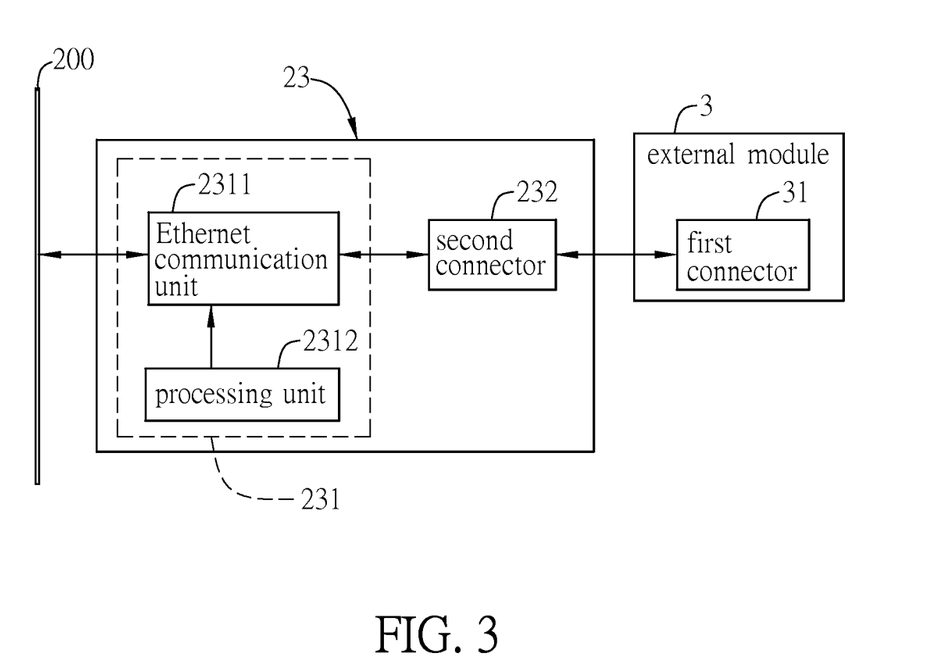
FIG. 3 is a schematic circuit diagram of an embodiment of the circuit board in FIG. 2A.

FIG. 3 is a schematic circuit diagram of an embodiment of the circuit board 23 in FIG. 2A. The power line Ethernet module 231 of the circuit board 23 includes an Ethernet communication unit 2311 and a processing unit 2312. The Ethernet communication unit 2311 is connected to the power line 200 of the building and the second connector 232. In this embodiment, the Ethernet communication unit 2311 is illustrated as the power line Ethernet circuit for example, mainly used to convert the received signal into the power line communication data (package) conforming to the power line communication standard. However, in other embodiments, the Ethernet communication unit 2311 also can be the power line Ethernet circuit combined with other communication circuits.

In the actual application, the external module 3 can transmit an original signal to the second connector 232 through the first connector 31. Then, by the Ethernet communication unit 2311, the original signal from the second connector 232 can be converted into the power line communication data according to the communication protocol between the Ethernet communication unit 2311 and the power line 200 and modulated to the power line 200 of the building for the transmission. The above-mentioned modulation method is, for example but not limited to, orthogonal frequency division multiplexing (OFDM). In detail, in this embodiment, the power line existing in the building functions as the backbone of the power line Ethernet and the power signal functions as the carrier wave for the signal transmission. The above-mentioned process also can be reversed, indicating that the Ethernet communication unit 2311 can demodulate the power line communication data transmitted through the power line 200 and convert it into the original signal to send it to the second connector 232 and even to the external module 3.

The processing unit 2312 is connected to the Ethernet communication unit 2311. The processing unit 2312 mainly controls the Ethernet communication unit 2311, such as the modulation method of the Ethernet communication unit 2311. However, this invention is not limited thereto.

As shown in FIG. 2D, in order to extend the application field of the power line Ethernet adaptor 2, the power line Ethernet adaptor 2 can include a transparent portion 26 in some embodiments. For example, the transparent portion 26 can be disposed at the position of the cover 22 corresponding to the external module 3 (as shown in FIG. 2A). Thereby, the user can directly see the situation of the external module 3 disposed in the power line Ethernet adaptor 2 through the transparent portion 26 without opening the cover 22. Moreover, the external module 3 also can be extended in application by receiving the variation of the external environment (such as light) through the transparent portion 26. However, this invention is not limited thereto.

Figure 4A:
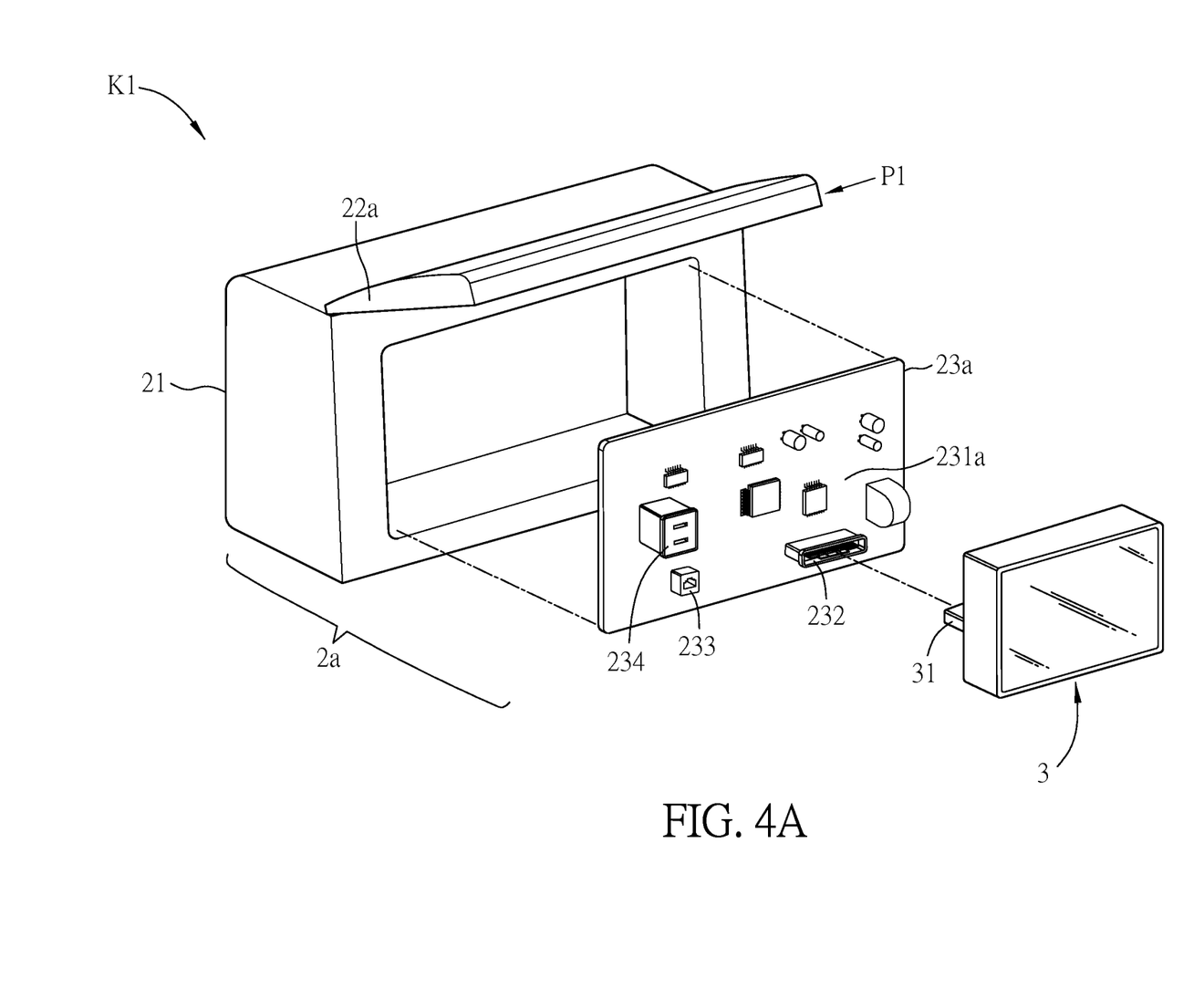
FIG. 4A is a schematic front exploded view of a power line Ethernet communication kit of another embodiment of the invention.
Figure 4B:
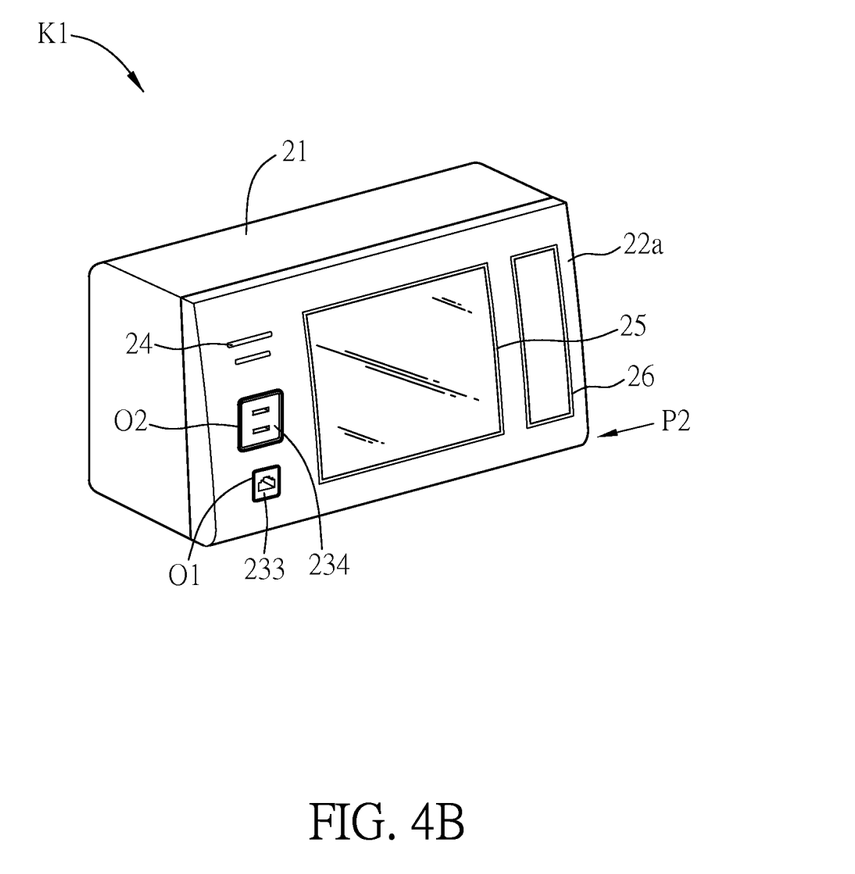
FIG. 4B is a schematic assembled diagram of the power line Ethernet communication kit of FIG. 4A.
Figure 5:
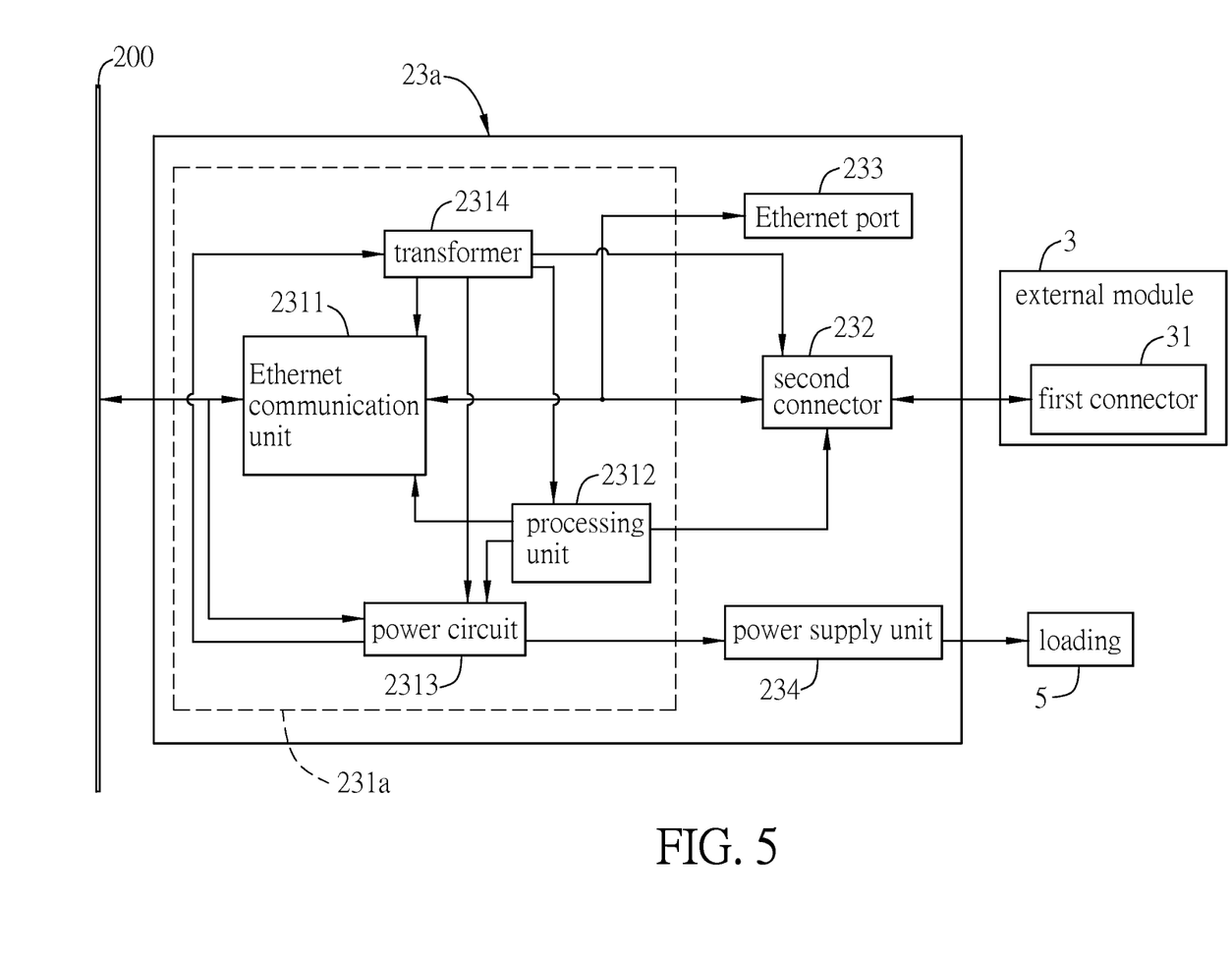
FIG. 5 is a schematic circuit diagram of an embodiment of the circuit board in FIG. 4A.

FIG. 4A is a schematic front exploded view of a power line Ethernet communication kit of another embodiment of the invention, FIG. 4B is a schematic assembled diagram of the power line Ethernet communication kit of FIG. 4A, and FIG. 5 is a schematic circuit diagram of an embodiment of the circuit board in FIG. 4A. As shown in FIGS. 4A and 5, different from the power line Ethernet adaptor 2 of the above embodiment (as shown in FIG. 2A), the circuit board 23a of the power line Ethernet adaptor 2a of this embodiment can further include an Ethernet port 233, which can be an RJ-45 or other kinds of ports. Besides, the cover 22a can have a first opening O1 disposed corresponding to the position of the Ethernet port 233 so that the Ethernet port 233 can be exposed, as shown in FIG. 4B, for the user's usage.

As shown in FIGS. 4A and 5, in this embodiment, the circuit board 23a also can have a power supply unit 234, which is electrically connected to the power line 200. The power supply unit 234 of FIG. 4A is illustrated as a power socket of the NEMA 1-15 standard for example. Actually, the power supply unit 234 also can be a power socket of other standards or can be any kind of power switch (such as a key switch or knob switch). Besides, the cover 22a can have a second opening O2 disposed corresponding to the position of the power supply unit 234 so that the power supply unit 234 can be exposed through the second opening O2, as shown in FIG. 4B. Therefore, the power supply unit 234 can be electrically connected to the external loading 5 (as shown in FIG. 5) to supply the working power from the power line 200 to the loading 5. For example, when the power supply unit 234 is a power socket, the loading 5 connected to the power supply unit 234 can be a general electronic device such as a computer. When the power supply unit 234 is a power switch, the loading 5 connected to the power supply unit 234 can be a general power consuming equipment, such as a light equipment. The working power is just the power source for the normal operation of the computer or light equipment.

As shown in FIG. 5, in this embodiment, the power line Ethernet module 231a can further include a power circuit 2313 and a transformer 2314, in addition to an Ethernet communication unit 2311 and a processing unit 2312. The elements in this embodiment have the same connection relations and functions as the same elements in the above-mentioned embodiment (the power line Ethernet module 231 in FIG. 3) and therefore are not described here for conciseness. The below is the detailed illustration of the power circuit 2313 and transformer 2314.

In this embodiment, the power circuit 2313 is electrically connected to the power line 200 of the building and mainly used to receive the city power from the power line 200. The transformer 2314 is electrically connected to the power circuit 2313, the second connector 232, the Ethernet communication unit 2311 and the processing unit 2312. The transformer 2314 changes the voltage of the power from the power circuit 2313 and converts it into a proper power source that is supplied to the second connector 232, the Ethernet communication unit 2311 and the processing unit 2312. In general, the transformer will execute voltage transformation, rectification, wave filtering and voltage stabilization, and they are well known by those skilled in the art and therefore are not described here for conciseness. In this embodiment, the transformer 2314 can further feed the transformed and converted power back to the power circuit 2313, so that the power circuit 2313 obtains the power source for the normal operation.

As shown in FIGS. 4A and 5, in this embodiment, the Ethernet port 233 can be electrically connected to the Ethernet communication unit 2311 of the power line Ethernet module 231a. Other electronic devices (such as a personal computer) can be electrically connected to the Ethernet port 233 through the Ethernet line. Therefore, the personal computer can be joined to the power line communication Ethernet through the Ethernet port 233 and the Ethernet communication unit 2311.

In this embodiment, the power supply unit 234 can be electrically connected to the power circuit 2313 so as to receive the power from the power line 200 through the power circuit 2313. The power supply unit 234 can be embodied as a socket or switch like the foregoing illustration and therefore is not described here for conciseness. However, in other embodiments, the power supply unit 234 also can be directly electrically connected to the power line 200 of the building.

Generally, some holes will be reserved for the later installation of sockets or switches during the construction, and the power line will be installed in the holes. Therefore, the above-mentioned power line Ethernet adaptors 2, 2a can be installed to the holes and electrically connected to the power line by a proper appearance and size design, so that the housing 21 looks like embedded into the wall surface of the building. Therefore, the occupied space can be saved, the pleasing appearance can be provided and the security can be enhanced.

Summarily, the power line Ethernet adaptor of the invention is suitable to work with an external module to form a power line Ethernet communication kit. The external module includes the first connector and the power line Ethernet adaptor includes the second connector. The first connector and the second connector can be electrically connected to each other to establish the signal connection between the external module and the power line Ethernet module. Therefore, the external module can be joined to the power line Ethernet through the power line Ethernet adaptor. In detail, the external module and the power line Ethernet adaptor can be connected to each other without through a physical Ethernet line or electric line (plug), and therefore the probability of the user being stumbled by the physical Ethernet line or electric line can be reduced.

Furthermore, the housing of the power line Ethernet adaptor has an accommodating space and the circuit board can be disposed therein. Therefore, when the first connector of the external module is electrically connected to the second connector of the circuit board, the external module is also disposed in the accommodating space. Besides, the cover of the power line Ethernet adaptor is movably connected to the housing so that the cover can move between the on-position and the off-position. When the external module is disposed in the housing and the cover is placed at the off-position, the cover can cover the external module. Thereby, the occupied space can be saved, and the connection between the external module and the power line Ethernet adaptor is uneasy to be loosed, short-circuited or oxidized due to the influence of the outside environment.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A power line Ethernet adaptor applied to an external module having a first connector, and comprising:
    a housing having an accommodating space;
    a cover movably connected to the housing to move between an on-position and an off-position, and covering the accommodating space when placed at the off-position; and
    a circuit board disposed in the accommodating space and having a power line Ethernet module and a second connector,
    wherein when at least a part of the external module is disposed in the accommodating space, the first connector and the second connector are electrically connected to each other to establish the signal connection between the external module and the power line Ethernet module, and the cover also covers the external module when placed at the off-position.

2. The power line Ethernet adaptor as recited in claim 1, wherein the cover moves between the on-position and the off-position by taking the joint of the cover and the housing as a pivot.

3. The power line Ethernet adaptor as recited in claim 1, wherein the cover moves between the on-position and the off-position in a translation motion.

4. The power line Ethernet adaptor as recited in claim 1, wherein the power line Ethernet module is electrically connected to a power line and further includes:
    an Ethernet communication unit connected to the second connector, converting an original signal from the first connector into a power line communication data and transmitting it to the power line for the transmission, or obtaining the power line communication data from the power line, converting it into the original signal and sending it to the second connector; and a processing unit connected to the Ethernet communication unit and controlling the Ethernet communication unit.

5. The power line Ethernet adaptor as recited in claim 4, wherein the power line Ethernet module further includes:

a power circuit connected to the power line and receiving a power from the power line; and a transformer connected to the power circuit, the second connector, the Ethernet communication unit and the processing unit, and transmitting the power from the power circuit to the second connector, the Ethernet communication unit and the processing unit, wherein the processing unit is connected to the power circuit and the second connector and controls the power circuit and the second connector.

6. The power line Ethernet adaptor as recited in claim 4, wherein the circuit board further includes:

a power supply unit connected to the power line, and receiving the power from the power line and outputting a working power, wherein the power supply unit is a power socket or a power switch.

7. The power line Ethernet adaptor as recited in claim 1, wherein at least a part of the housing is suitable to be embedded into a wall surface of a building.

8. The power line Ethernet adaptor as recited in claim 1, wherein the cover has a transparent portion.

9. The power line Ethernet adaptor as recited in claim 1, wherein the cover further includes a through hole, the circuit board further includes a speech processing module, and the position of the through hole corresponds to the speech processing module.

10. The power line Ethernet adaptor as recited in claim 1, wherein the cover further includes a through hole, the circuit board further includes a speaker, and the position of the through hole corresponds to the speaker.

11. A power line Ethernet communication kit, comprising:

an external module including a first connector; and a power line Ethernet adaptor, including:

a housing having an accommodating space;

a cover movably connected to the housing to move between an on-position and an off-position, and covering the accommodating space when placed at the off-position; and a circuit board disposed in the accommodating space and having a power line Ethernet module and a second connector, wherein when at least a part of the external module is disposed in the accommodating space, the first connector and the second connector are electrically connected to each other to establish the signal connection between the external module and the power line Ethernet module, and the cover also covers the external module when placed at the off-position.

12. The power line Ethernet communication kit as recited in claim 11, wherein the cover moves between the on-position and the off-position by taking the joint of the cover and the housing as a pivot.

13. The power line Ethernet communication kit as recited in claim 11, wherein the cover moves between the on-position and the off-position in a translation motion.

14. The power line Ethernet communication kit as recited in claim 11, wherein the power line Ethernet module is electrically connected to a power line and further includes:

an Ethernet communication unit connected to the second connector, converting an original signal from the first connector into a power line communication data and transmitting it to the power line for the transmission, or obtaining the power line communication data from the power line, converting it into the original signal and sending it to the second connector; and a processing unit connected to the Ethernet communication unit and controlling the Ethernet communication unit.

15. The power line Ethernet communication kit as recited in claim 14, wherein the power line Ethernet module further includes:

a power circuit connected to the power line and receiving a power from the power line; and a transformer connected to the power circuit, the second connector, the Ethernet communication unit and the processing unit, and transmitting the power from the power circuit to the second connector, the Ethernet communication unit and the processing unit, wherein the processing unit is connected to the power circuit and the second connector and controls the power circuit and the second connector.

16. The power line Ethernet communication kit as recited in claim 14, wherein the circuit board further includes:

a power supply unit connected to the power line, and receiving the power from the power line and outputting a working power, wherein the power supply unit is a power socket or a power switch.

17. The power line Ethernet communication kit as recited in claim 11, wherein at least a part of the housing is suitable to be embedded into a wall surface of a building.

18. The power line Ethernet communication kit as recited in claim 11, wherein the cover has a transparent portion.

19. The power line Ethernet communication kit as recited in claim 11, wherein the cover further includes a through hole, the circuit board further includes a speech processing module, and the position of the through hole corresponds to the speech processing module.

20. The power line Ethernet communication kit as recited in claim 11, wherein the cover further includes a through hole, the circuit board further includes a speaker, and the position of the through hole corresponds to the speaker.

* * * * *